United States Patent
Habana et al.

(10) Patent No.: US 12,355,413 B2
(45) Date of Patent: Jul. 8, 2025

(54) CAP SUBSTRATE FOR ACOUSTIC WAVE DEVICE

(71) Applicant: Skyworks Solutions, Inc., Irvine, CA (US)

(72) Inventors: Wilfred Ryan Vidamo Habana, Singapore (SG); Hidekazu Nakanishi, Sakai (JP); XiaoJun Chew, Singapore (SG); Mitsuhiro Furukawa, Nishinomiya (JP)

(73) Assignee: Skyworks Solutions, Inc., Irvine, CA (US)

( * ) Notice: Subject to any disclaimer, the term of this patent is extended or adjusted under 35 U.S.C. 154(b) by 519 days.

(21) Appl. No.: 17/658,180

(22) Filed: Apr. 6, 2022

(65) Prior Publication Data
US 2022/0337217 A1    Oct. 20, 2022

Related U.S. Application Data

(60) Provisional application No. 63/201,225, filed on Apr. 19, 2021, provisional application No. 63/201,223, filed on Apr. 19, 2021.

(51) Int. Cl.
*H03H 3/02* (2006.01)
*H03H 9/10* (2006.01)
*H03H 9/54* (2006.01)

(52) U.S. Cl.
CPC .............. *H03H 3/02* (2013.01); *H03H 9/105* (2013.01); *H03H 9/54* (2013.01)

(58) Field of Classification Search
CPC ............ H03H 9/54; H03H 3/02; H03H 9/105; H03H 9/1014
See application file for complete search history.

(56) References Cited

U.S. PATENT DOCUMENTS

| | | | |
|---|---|---|---|
| 6,262,513 B1 | 7/2001 | Furukawa et al. | |
| 8,836,111 B2 | 9/2014 | Conti et al. | |
| 9,002,038 B2 | 4/2015 | Ochs et al. | |
| 9,337,354 B2 | 5/2016 | Protheroe et al. | |
| 9,484,886 B2 | 11/2016 | Takemura | |
| 9,822,001 B2 | 11/2017 | Gritti et al. | |
| 11,309,864 B2 | 4/2022 | Ibaragi et al. | |
| 2003/0160541 A1 | 8/2003 | Ikeda et al. | |
| 2004/0232802 A1* | 11/2004 | Koshido | H03H 9/6483 29/25.35 |
| 2006/0033189 A1 | 2/2006 | Haba et al. | |

(Continued)

OTHER PUBLICATIONS

Lee et al., "A cost-effective MEMS cavity packaging technology for mass production", IEEE Trans. Adv Packaging, vol. 32(2):453-460 (2009).

*Primary Examiner* — Daniel Pihulic
(74) *Attorney, Agent, or Firm* — Knobbe, Martens, Olson & Bear LLP

(57) ABSTRACT

A packaged acoustic wave component includes a device substrate and an acoustic wave device mounted on the device substrate. A peripheral wall is attached to the device substrate and surrounds the acoustic wave device. A cap substrate is attached to the peripheral wall and spaced above the device substrate. The cap substrate has a marking layer disposed on a bottom surface of the cap substrate that is disposed above and faces the acoustic wave device. The marking layer is configured to receive one or more markings thereon.

20 Claims, 9 Drawing Sheets

(56) References Cited

U.S. PATENT DOCUMENTS

| | | |
|---|---|---|
| 2006/0131731 A1 | 6/2006 | Sato |
| 2009/0001849 A1 | 1/2009 | Tsuda |
| 2011/0084382 A1 | 4/2011 | Chen et al. |
| 2020/0076402 A1* | 3/2020 | Koo ..................... B23K 26/355 |
| 2022/0321102 A1* | 10/2022 | Shirakawa ......... H03H 9/02574 |
| 2022/0337213 A1* | 10/2022 | Habana .................. H03H 9/105 |
| 2022/0337217 A1* | 10/2022 | Habana .................... H03H 9/54 |
| 2023/0101228 A1 | 3/2023 | Brunner et al. |

* cited by examiner

300

302

304

306

308

310

312

314

316

318

320

CAP SUBSTRATE FOR ACOUSTIC WAVE DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include bulk acoustic wave (BAW) filters.

SUMMARY

In accordance with one aspect of the disclosure, a bulk acoustic wave (BAW) device package is provided with a cap substrate having an underside marking layer to allow identification data to be provided on the underside of the cap substrate. Such markings can advantageously provide for traceability of the cap substrate in small chips (e.g., chips dimensioned smaller than 565 um×495 um).

In accordance with one aspect of the disclosure, a packaged acoustic wave device component is provided. The packaged acoustic wave component comprises a device substrate, and an acoustic wave device mounted on the device substrate. A peripheral wall is attached to the device substrate and surrounds the acoustic wave device, and a cap substrate is attached to the peripheral wall and spaced above the device substrate. The cap substrate has a marking layer disposed on a bottom surface of the cap substrate that is spaced from and faces the acoustic wave device. The marking layer is configured to receive one or more markings thereon.

In accordance with another aspect of the disclosure, radio frequency module is provided. The radio frequency module comprises a package substrate and a packaged acoustic wave component. The packaged acoustic wave component comprises a device substrate and an acoustic wave device mounted on the device substrate. A peripheral wall is attached to the device substrate and surrounds the acoustic wave device, and a cap substrate is attached to the peripheral wall and spaced above the device substrate. The cap substrate has a marking layer disposed on a bottom surface of the cap substrate that is spaced from and faces the acoustic wave device. The marking layer is configured to receive one or more markings thereon. The radio frequency module also comprises additional circuitry, the packaged acoustic wave component and additional circuitry disposed on the package substrate.

In accordance with another aspect of the disclosure, a wireless communication device is provided. The wireless communication device comprises an antenna and a front end module including one or more packaged acoustic wave components configured to filter a radio frequency signal associated with the antenna. Each packaged acoustic wave component includes a device substrate and an acoustic wave device mounted on the device substrate. A peripheral wall is attached to the device substrate and surrounds the acoustic wave device, and a cap substrate is attached to the peripheral wall and spaced above the device substrate. The cap substrate has a marking layer disposed on a bottom surface of the cap substrate that is spaced from and faces the acoustic wave device. The marking layer is configured to receive one or more markings thereon.

In accordance with another aspect of the disclosure, a method of manufacturing a packaged acoustic wave component is provided. The method comprises forming or providing a cap substrate, forming a metal layer on a surface of the cap substrate, and marking the metal layer with one or more alphanumeric indicia. The method also comprises bonding the cap substrate to a device substrate that has an acoustic wave device on a surface thereof such that the metal layer is spaced from and faces the acoustic wave device.

In accordance with another aspect of the disclosure, a method of manufacturing a packaged acoustic wave component is provided. The method comprises forming or providing a cap substrate, forming a metal layer on a surface of the cap substrate, marking the metal layer with one or more alphanumeric indicia, and forming a peripheral wall attached to the cap substrate, the peripheral wall spaced from and surrounding the metal layer.

BRIEF DESCRIPTION OF THE DRAWINGS

Embodiments of this disclosure will now be described, by way of non-limiting example, with reference to the accompanying drawings.

DETAILED DESCRIPTION

Figure 1:
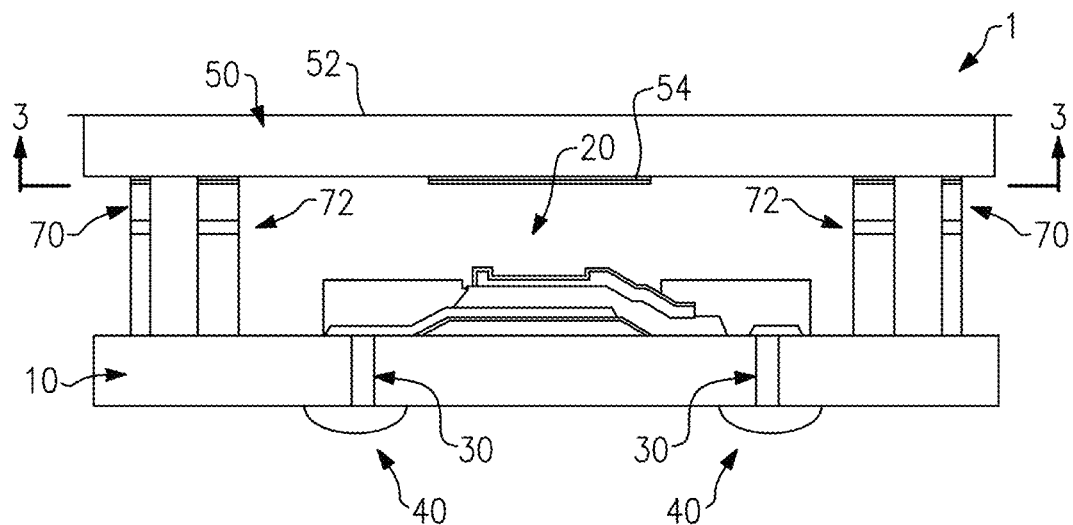
FIG. 1 illustrates a schematic cross-sectional side view of an acoustic wave device structure.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with bulk acoustic wave (BAW) devices.

FIG. 1 illustrates a bulk acoustic wave (BAW) package or component 1 with a bulk acoustic wave (BAW) resonator or device 20 disposed on (e.g., mounted to) a device substrate 10. The BAW resonator 20 can be electrically connected to terminals 40 (e.g., on an opposite surface of the device substrate 10 from the BAW resonator 20) by vias (e.g., through-silicon vias or TSVs) 30. The terminals 40 can be ball grid array (BGA) terminals. In another example, the terminals 40 can be land grid array (LGA) terminals. The BAW package or component 1 includes a cap substrate 50 disposed over and space from the device substrate 10. A peripheral wall 70 extends between and attaches the cap substrate 50 to the device substrate 10 and encloses (e.g., surrounds) the BAW resonator 20. Additionally, pillars 72 can be disposed between the BAW resonator 20 and the peripheral wall 70. The device substate 10 and the cap substrate 50 can be made of silicon. The cap substrate 50 has a top surface 52 and a bottom (e.g., underside) surface 54. The bottom (e.g., underside) surface 54 has a marking layer 55 that can have one or more markings associated with the cap substrate 50 thereon. In one example, the package or component 1 can have a size (e.g., width and length) smaller than 565 um×495 um.

Figure 2:
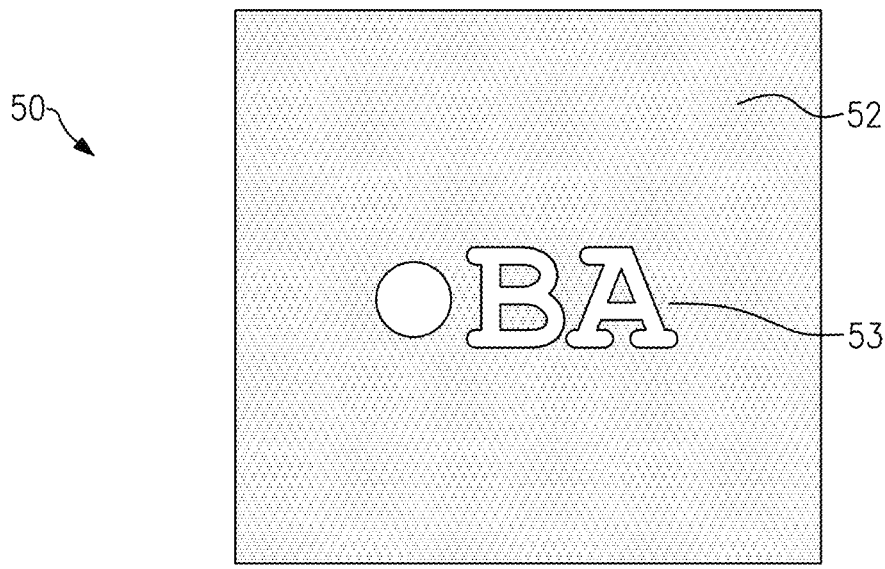
FIG. 2 illustrates a schematic top view of a cap substrate for an acoustic wave device.
Figure 3:
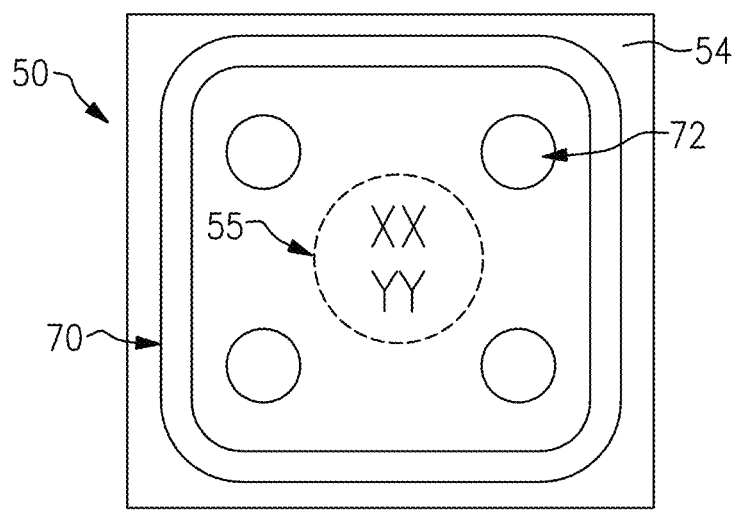
FIG. 3 illustrates a schematic bottom view of a cap substrates for an acoustic wave device.
Figure 4:
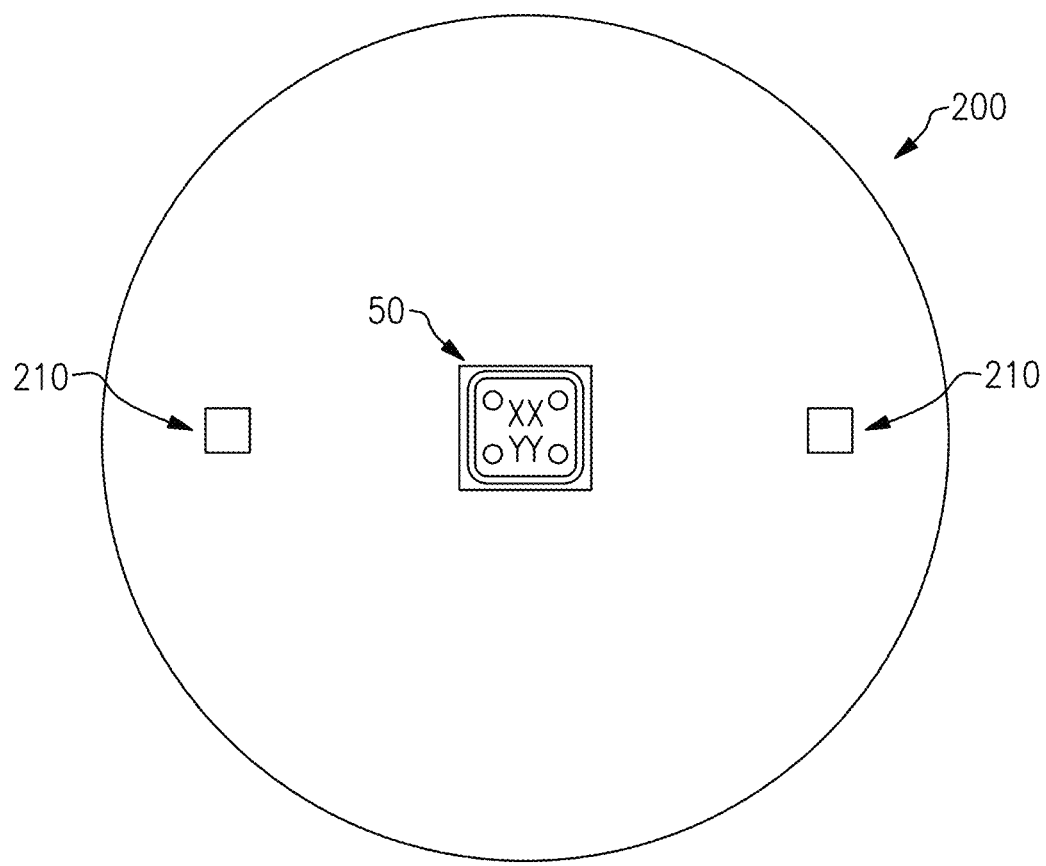
FIG. 4 illustrates a wafer from which multiple cap substrates are cut.

FIG. 2 shows a top view of the cap substrate 50, which can have various different markings 53 on the top surface 52 of the cap substrate 50. FIG. 3 shows a bottom (e.g., underside) view of the cap substrate 50, with a marking layer 55 on the bottom (e.g., underside) surface 54 of the cap substrate 50. The marking layer 55 can be defined between the posts 72. In one example, the marking layer 55 can be circular; however, the marking layer 55 can have other suitable shapes. The marking layer 55 can have one or more markings. For example, the marking layer 55 can have markings (e.g., XXYY coordinates, alphanumeric indicia) corresponding with coordinates on the wafer 200 (see FIG. 4) associated with the location of the cap substrate 50 before the cap substrate 50 was cut from the wafer 200. The wafer 200 can have alignment keys 210 for aligning the wafer 200 before the cap substrates, such as the cap substrate 50, are cut.

Figure 5A:
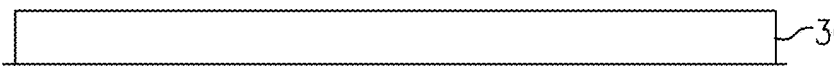
FIGS. 5A-5T show steps in a process for manufacturing the bulk acoustic wave device structure of FIG. 1.
Figure 5B:
Figure 5C:
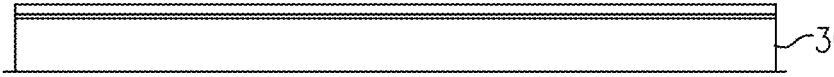
Figure 5D:
Figure 5E:
Figure 5F:
Figure 5G:
Figure 5H:
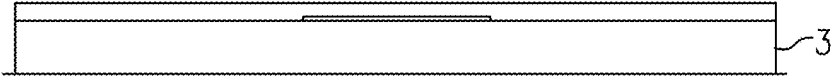
Figure 5I:
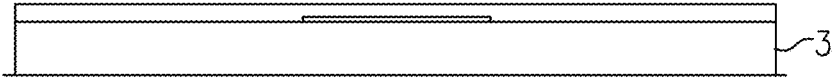
Figure 5J:
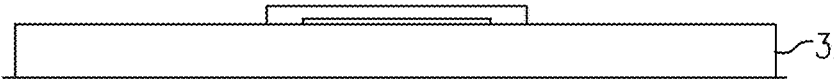
Figure 5K:
Figure 5L:
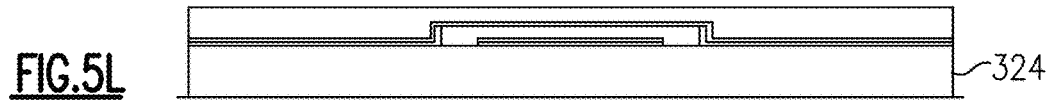
Figure 5M:
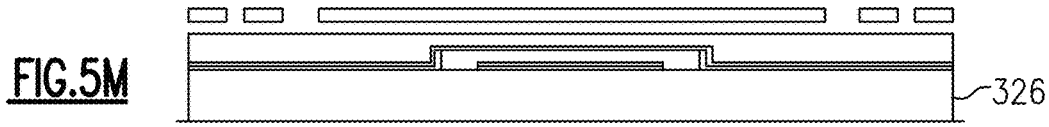
Figure 5N:
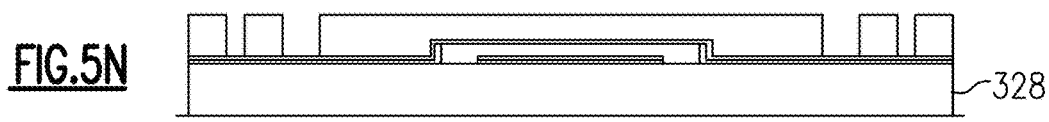
Figure 5O:
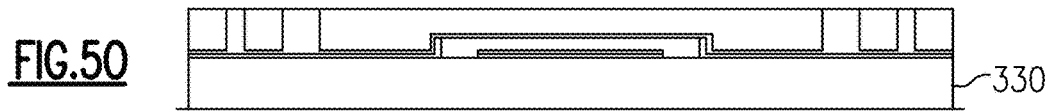
Figure 5P:
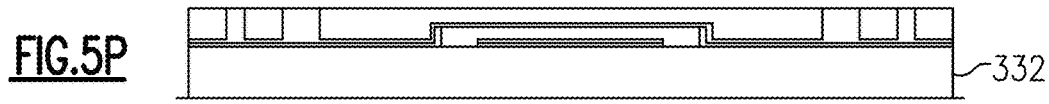
Figure 5Q:
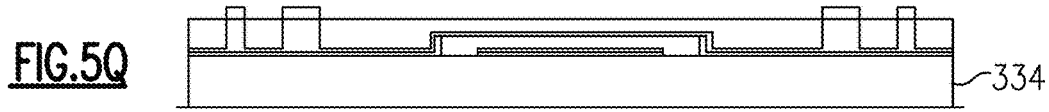
Figure 5R:
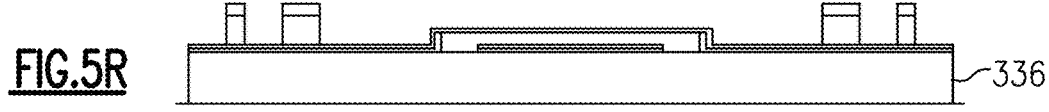
Figure 5S:
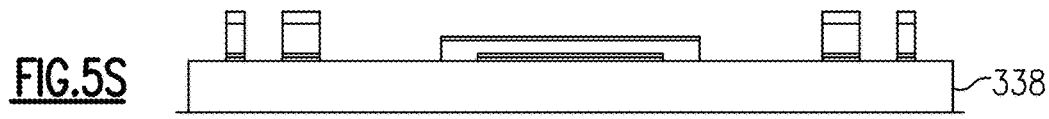
Figure 5T:
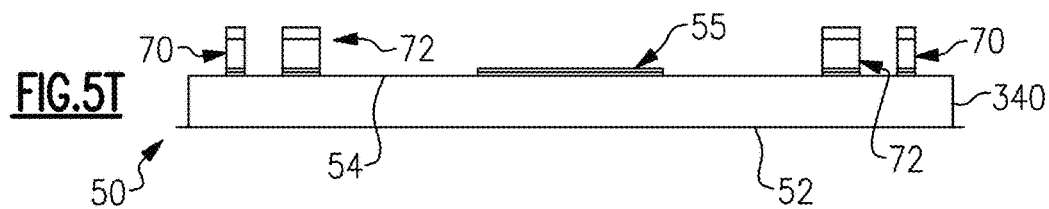

FIGS. 5A-5T show steps (in order) of a process or method 300 for manufacturing a cap substrate for an acoustic wave package or component, such as the cap substrate 50 of the BAW package or component 1 of FIG. 1. The process 300 includes the step 302 of forming or providing a cap substrate and laser marking the substrate (e.g., traceability marking on the cap substrate, followed by the step 304 of depositing (e.g., by sputtering) a metal layer (e.g., of titanium (Ti), of copper (Cu)) on the substrate. The process 300 also includes the step 306 of applying a resist coating (e.g., positive resist coating), followed by the step 308 of exposing the resist layer to create a pattern (e.g., pattern of the XXYY coordinates of the cap substrate and alignment key). The process 300 additionally includes the step 310 of developing the exposed resist layer (e.g., development of the XXYY coordinates and alignment key), followed by the step 312 of removing (e.g., etching, such as wet etching) at least a portion of the metal layer (e.g., removal of the sputtered metal layer). The process 300 further includes the step 314 of removing the resist coating layer (e.g., leaving the XXYY coordinates and alignment key), followed by the step 316 of applying a second resist coating to the substrate (e.g., to protect the XXYY coordinates and alignment key). The process 300 also includes the step 318 of exposing the second resist layer (e.g., expose the XXYY coordinates of the cap substrate and alignment key), followed by the step 320 of developing the exposed second resist layer (e.g., development of the XXYY coordinates and alignment key). The process 300 additionally includes the step 322 of depositing (e.g., by sputtering) a second metal layer (e.g., of titanium (Ti), of copper (Cu)) on the substrate and exposed second resist layer, followed by the step 324 of applying a third resist coating on the cap substrate and second metal layer. The process 300 further includes the step 326 of exposing the third resist layer (e.g., exposure to prepare the peripheral wall and pillar pattern), followed by the step 328 of developing the exposed third resist layer (e.g., to develop the peripheral wall and pillar pattern). The process 300 also includes the step 330 of plating a metal (e.g., copper (Cu), such as to define the peripheral wall and pillars), followed by the step 332 of surface planning to "fly-cut" the third resist layer and plated meal (e.g., copper (Cu)) to ensure its flatness, followed by the step 334 of plating a layer of metal (e.g., tin (Sn)) in preparation for bonding of the cap substrate to the device substrate. The process 300 additionally includes the step 336 of removing the third resist layer (e.g., chemically), followed by the step 338 of removing (e.g., etching, such as wet etching) the second metal layer. Finally, the process 300 includes the step 340 of removing the third resist layer (e.g., remove the resist coating over the XXYY coordinates and alignment key). The cap substrate can then be inverted and attached to (e.g., bonded) to a device substrate (e.g., that has an acoustic wave device, such as a BAW resonator thereon).

Figure 6A:
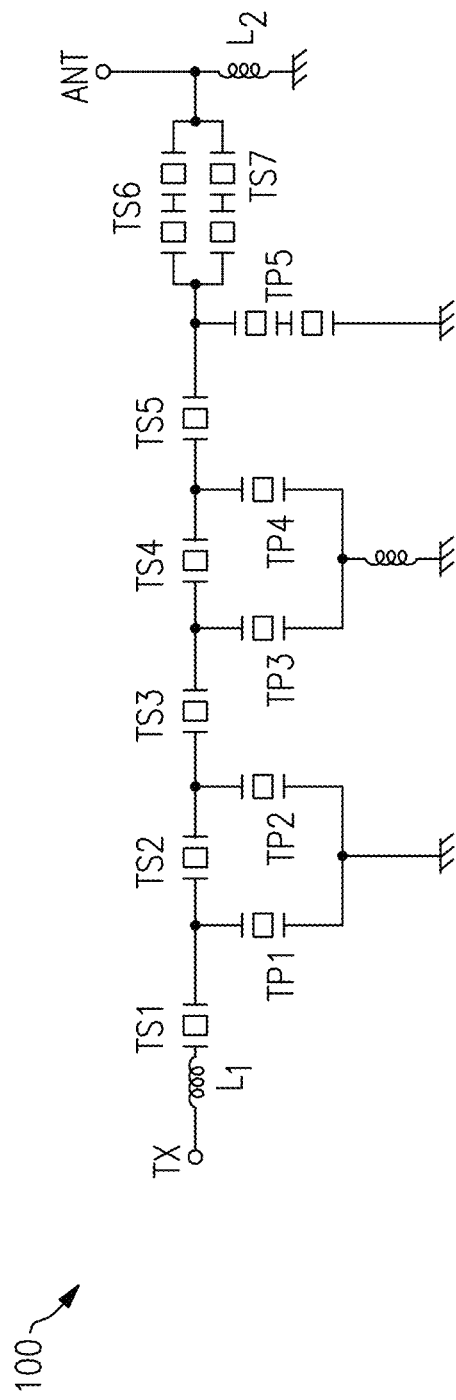
FIG. 6A is a schematic diagram of a transmit filter that includes an acoustic wave resonator according to an embodiment.

FIG. 6A is a schematic diagram of an example transmit filter 100 that includes surface acoustic wave resonators according to an embodiment. The transmit filter 100 can be a band pass filter. The illustrated transmit filter 100 is arranged to filter a radio frequency signal received at a transmit port TX and provide a filtered output signal to an antenna port ANT. Some or all of the resonators TS1 to TS7 and/or TP1 to TP5 can be a BAW resonator in accordance with any suitable principles and advantages disclosed herein. For instance, one or more of the BAW resonators of the transmit filter 100 can be an acoustic wave device 20 of a packaged acoustic wave components 1 of FIG. 1. Alternatively or additionally, one or more of the BAW resonators of the transmit filter 100 can be any acoustic wave resonator disclosed herein. Any suitable number of series BAW resonators and shunt BAW resonators can be included in a transmit filter 100.

Figure 6B:
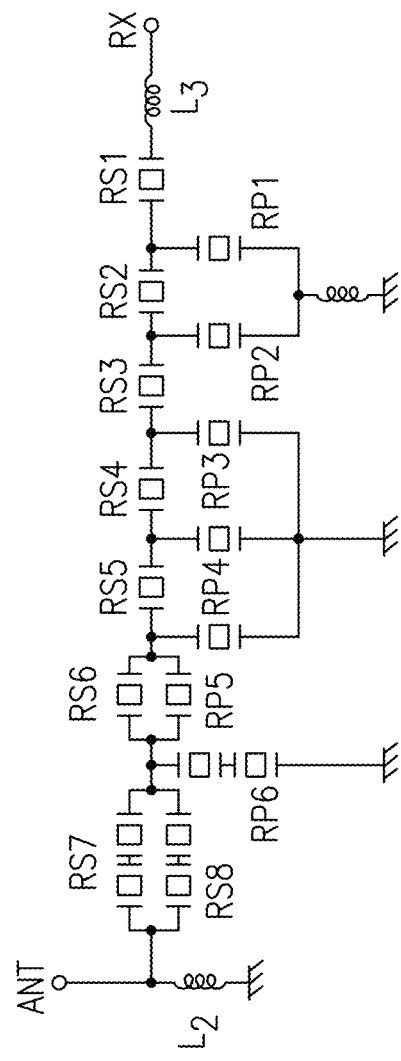
FIG. 6B is a schematic diagram of a receive filter that includes an acoustic wave resonator according to an embodiment.

FIG. 6B is a schematic diagram of a receive filter 105 that includes bulk acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the resonators RS1 to RS8 and/or RP1 to RP6 can be BAW resonators in accordance with any suitable principles and advantages disclosed herein. For instance, one or more of the BAW resonators of the receive filter 105 can be an acoustic wave device 20 of a packaged acoustic wave components 1 of FIG. 1. Alternatively or additionally, one or more of the BAW resonators of the receive filter 105 can be any acoustic wave resonator disclosed herein. Any suitable number of series BAW resonators and shunt BAW resonators can be included in a receive filter 105.

Although FIGS. 6A and 6B illustrate example ladder filter topologies, any suitable filter topology can include a BAW resonator in accordance with any suitable principles and advantages disclosed herein. Example filter topologies include ladder topology, a lattice topology, a hybrid ladder and lattice topology, a multi-mode BAW filter, a multi-mode BAW filter combined with one or more other BAW resonators, and the like.

Figure 7:
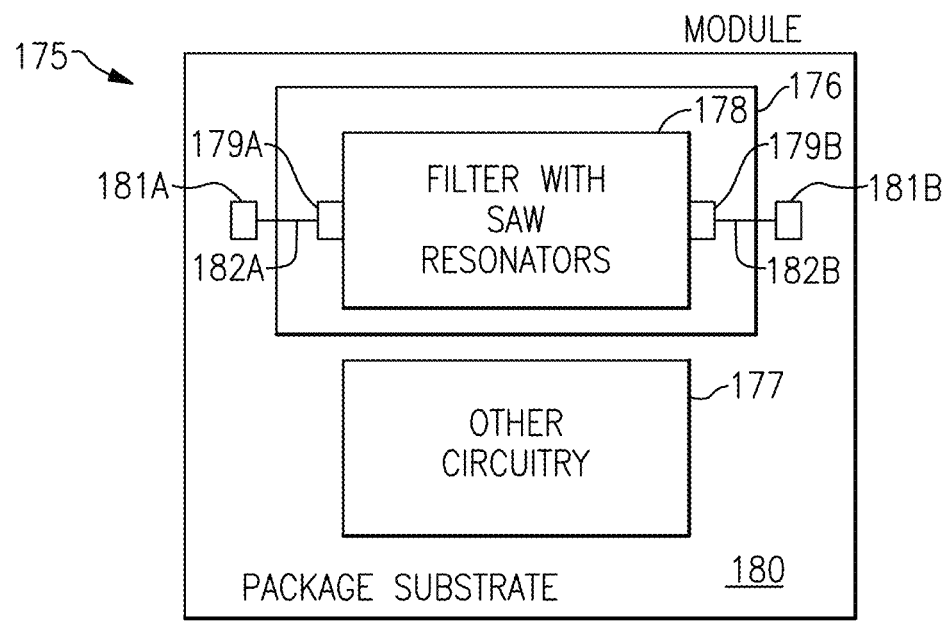
FIG. 7 is a schematic diagram of a radio frequency module that includes a bulk acoustic wave resonator according to an embodiment.

FIG. 7 is a schematic diagram of a radio frequency module 175 that includes an acoustic wave component 176 according to an embodiment. The illustrated radio frequency module 175 includes the BAW component 176 and other circuitry 177. The BAW component 176 can include one or more BAW resonators with any suitable combination of features of the BAW resonators disclosed herein. The BAW component 176 can include a BAW die that includes BAW resonators.

The BAW component 176 shown in FIG. 7 includes a filter 178 and terminals 179A and 179B. The filter 178 includes BAW resonators. One or more of the BAW resonators can be implemented in accordance with any suitable principles and advantages of the acoustic wave devices 20 of the packaged acoustic wave components 1 of FIG. 1 and/or any acoustic wave resonator disclosed herein. The terminals 179A and 178B can serve, for example, as an input contact and an output contact. The BAW component 176 and the other circuitry 177 are on a common packaging substrate 180 in FIG. 9. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 8:
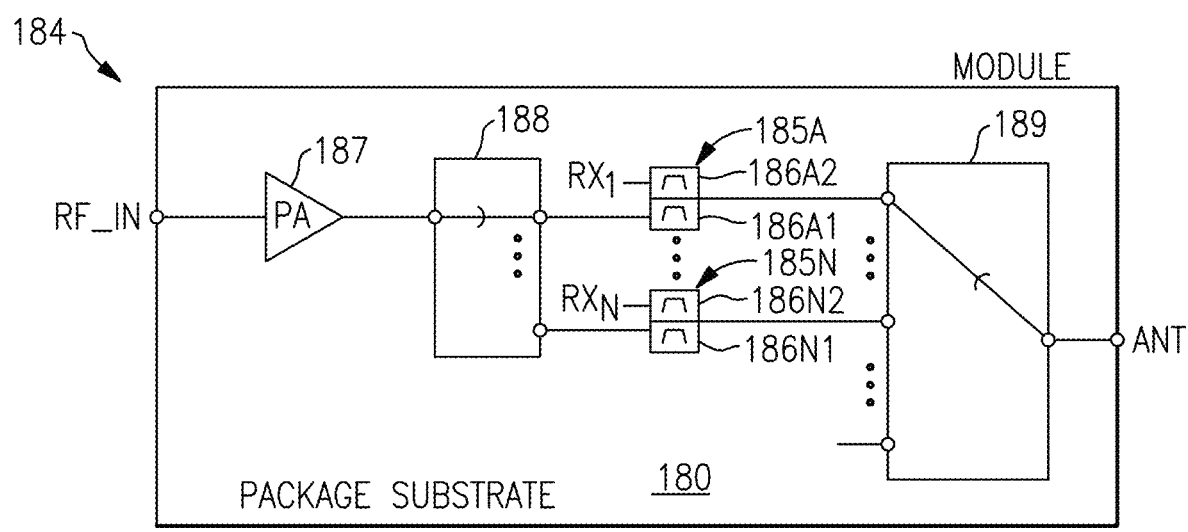
FIG. 8 is a schematic diagram of a radio frequency module that includes filters with acoustic wave resonators according to an embodiment.

FIG. 8 is a schematic diagram of a radio frequency module 184 that includes a bulk acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more BAW resonators in accordance with any suitable principles and advantages disclosed herein. Similarly, one or more of the receive filters 186A2 to 186N2 can include one or more BAW resonators in accordance with any suitable principles and advantages disclosed herein. Although FIG. 8 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 9:
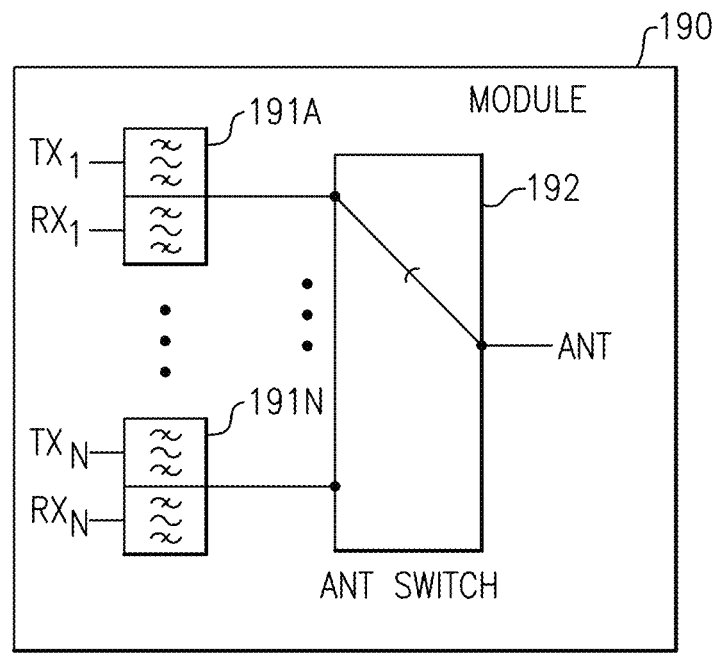
FIG. 9 is a schematic block diagram of a module that includes an antenna switch and duplexers that include an acoustic wave resonator according to an embodiment.

FIG. 9 is a schematic block diagram of a module 190 that includes duplexers 191A to 191N and an antenna switch 192. One or more filters of the duplexers 191A to 191N can include any suitable number of bulk acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 10A:
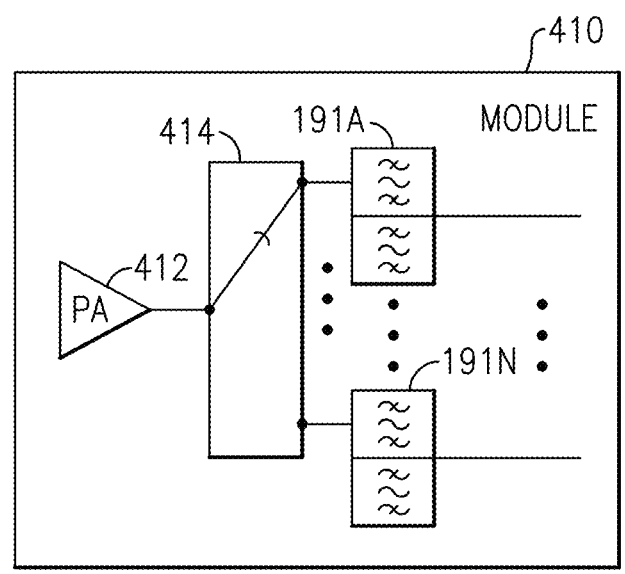
FIG. 10A is a schematic block diagram of a module that includes a power amplifier, a radio frequency switch, and duplexers that include an acoustic wave resonator according to an embodiment.

FIG. 10A is a schematic block diagram of a module 410 that includes a power amplifier 412, a radio frequency switch 414, and duplexers 191A to 191N in accordance with one or more embodiments. The power amplifier 412 can amplify a radio frequency signal. The radio frequency switch 414 can be a multi-throw radio frequency switch. The radio frequency switch 414 can electrically couple an output of the power amplifier 412 to a selected transmit filter of the duplexers 191A to 191N. One or more filters of the duplexers 191A to 191N can include any suitable number of bulk acoustic wave resonators in accordance with any suitable principles and advantages discussed herein. Any suitable number of duplexers 191A to 191N can be implemented.

Figure 10B:
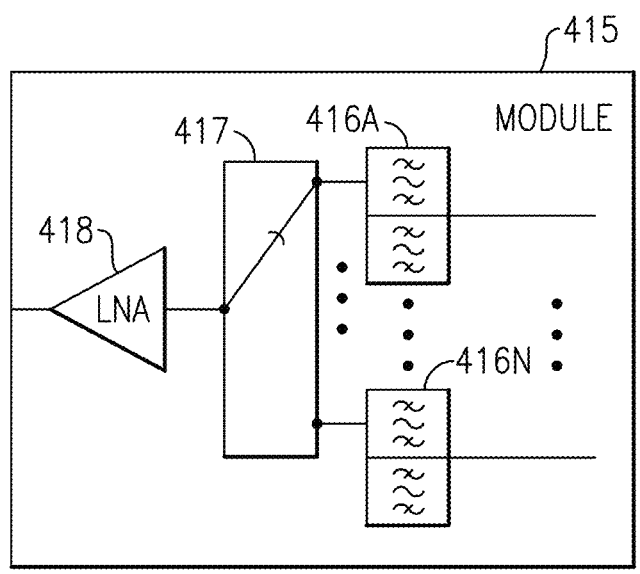
FIG. 10B is a schematic block diagram of a module that includes filters, a radio frequency switch, and a low noise amplifier according to an embodiment.

FIG. 10B is a schematic block diagram of a module 415 that includes filters 416A to 416N, a radio frequency switch 417, and a low noise amplifier 418 according to an embodiment. One or more filters of the filters 416A to 416N can include any suitable number of acoustic wave resonators in accordance with any suitable principles and advantages disclosed herein. Any suitable number of filters 416A to 416N can be implemented. The illustrated filters 416A to 416N are receive filters. In some embodiments (not illustrated), one or more of the filters 416A to 416N can be included in a multiplexer that also includes a transmit filter. The radio frequency switch 417 can be a multi-throw radio frequency switch. The radio frequency switch 417 can electrically couple an output of a selected filter of filters 416A to 416N to the low noise amplifier 418. In some embodiments (not illustrated), a plurality of low noise amplifiers can be implemented. The module 415 can include diversity receive features in certain applications.

Figure 11A:
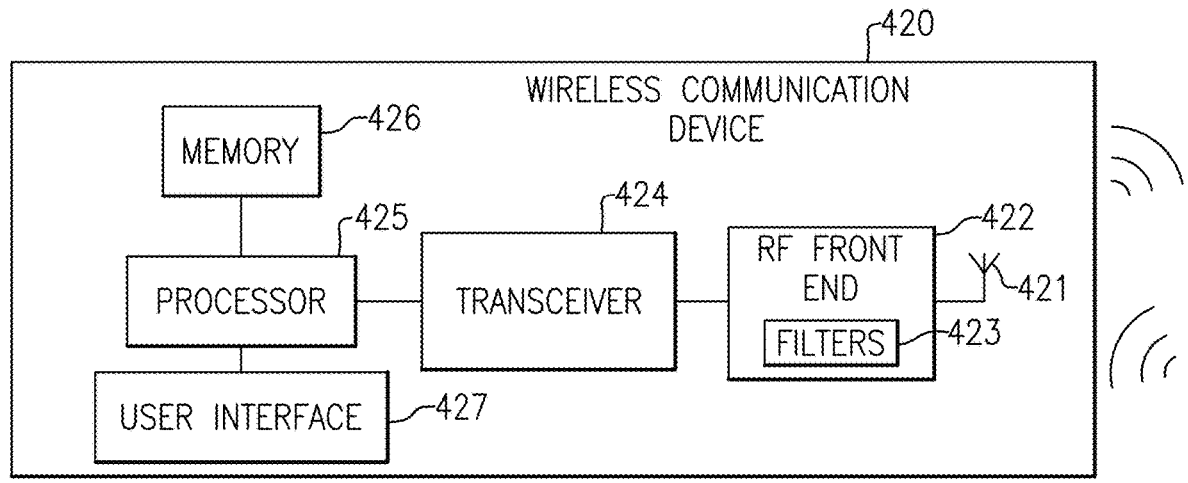
FIG. 11A is a schematic block diagram of a wireless communication device that includes a filter with an acoustic wave resonator in accordance with one or more embodiments.

FIG. 11A is a schematic diagram of a wireless communication device 420 that includes filters 423 in a radio frequency front end 422 according to an embodiment. The filters 423 can include one or more BAW resonators in accordance with any suitable principles and advantages discussed herein. The wireless communication device 420 can be any suitable wireless communication device. For instance, a wireless communication device 420 can be a mobile phone, such as a smart phone. As illustrated, the wireless communication device 420 includes an antenna 421, an RF front end 422, a transceiver 424, a processor 425, a memory 426, and a user interface 427. The antenna 421 can transmit/receive RF signals provided by the RF front end 422. Such RF signals can include carrier aggregation signals. Although not illustrated, the wireless communication device 420 can include a microphone and a speaker in certain applications.

The RF front end 422 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 422 can transmit and receive RF signals associated with any suitable communication standards. The filters 423 can include BAW resonators of a BAW component that includes any suitable combination of features discussed with reference to any embodiments discussed above.

The transceiver 424 can provide RF signals to the RF front end 422 for amplification and/or other processing. The transceiver 424 can also process an RF signal provided by a low noise amplifier of the RF front end 422. The transceiver 424 is in communication with the processor 425. The processor 425 can be a baseband processor. The processor 425 can provide any suitable base band processing functions for the wireless communication device 420. The memory 426 can be accessed by the processor 425. The memory 426 can store any suitable data for the wireless communication device 420. The user interface 427 can be any suitable user interface, such as a display with touch screen capabilities.

Figure 11B:
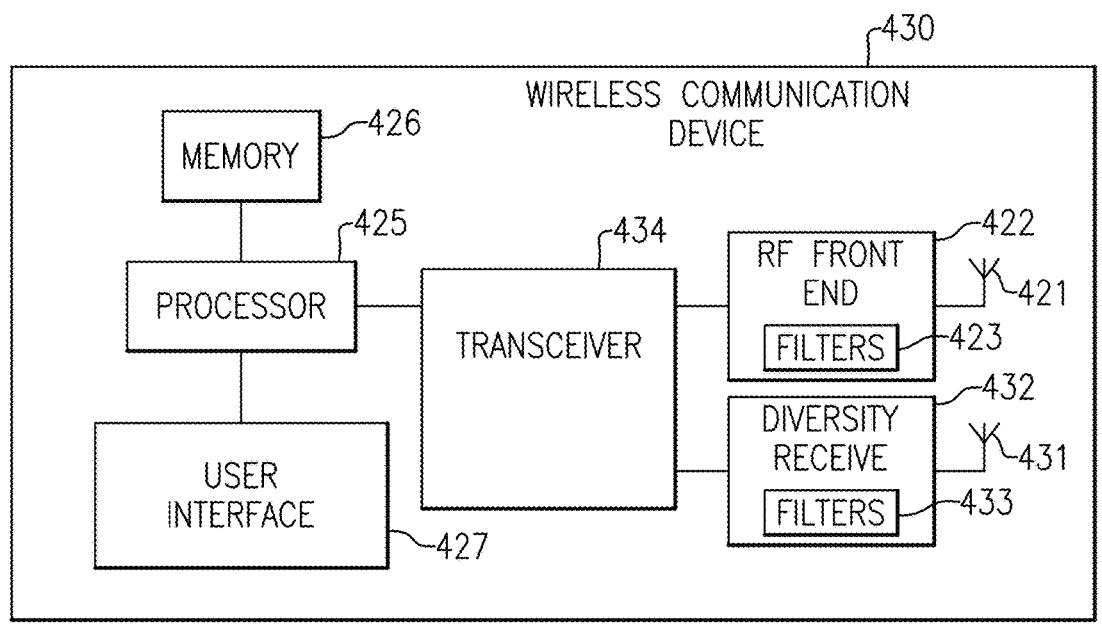
FIG. 11B is a schematic block diagram of another wireless communication device that includes a filter with an acoustic wave resonator in accordance with one or more embodiments.

FIG. 11B is a schematic diagram of a wireless communication device 430 that includes filters 423 in a radio frequency front end 422 and a second filter 433 in a diversity receive module 432. The wireless communication device 430 is like the wireless communication device 400 of FIG. 11A, except that the wireless communication device 430 also includes diversity receive features. As illustrated in FIG. 11B, the wireless communication device 430 includes a diversity antenna 431, a diversity module 432 configured to process signals received by the diversity antenna 431 and including filters 433, and a transceiver 434 in communication with both the radio frequency front end 422 and the diversity receive module 432. The filters 433 can include one or more BAW resonators that include any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged acoustic wave component comprising:
   a device substrate;
   an acoustic wave device mounted on the device substrate;
   a peripheral wall attached to the device substrate and surrounding the acoustic wave device; and
   a cap substrate attached to the peripheral wall and spaced above the device substrate, the cap substrate having a marking layer disposed on a bottom surface of the cap substrate that is spaced from and faces the acoustic wave device, the marking layer configured to receive one or more markings thereon, the one or more markings being coordinates associated with a location of the cap substrate on a parent wafer.

2. The packaged acoustic wave component of claim 1 wherein the marking layer is centered on the bottom surface of the cap substrate.

3. The packaged acoustic wave component of claim 1 wherein the marking layer is planar.

4. The packaged acoustic wave component of claim 1 wherein the acoustic wave device is a bulk acoustic wave device.

5. The packaged acoustic wave component of claim 1 further including one or more pillars between the peripheral wall and the marking layer.

6. The packaged acoustic wave component of claim 1 wherein the cap substrate has a dimension of no more than 565 um by 495 um.

7. The packaged acoustic wave component of claim 1 wherein marking layer is circular.

8. A radio frequency module comprising:
   a package substrate;
   a packaged acoustic wave component including a device substrate, an acoustic wave device mounted on the device substrate, a peripheral wall attached to the device substrate and surrounding the acoustic wave device, and a cap substrate attached to the peripheral wall and spaced above the device substrate, the cap substrate having a marking layer disposed on a bottom surface of the cap substrate that is spaced from and faces the acoustic wave device, the marking layer configured to receive one or more markings thereon, the one or more markings being coordinates associated with a location of the cap substrate on a parent wafer; and
   additional circuitry, the packaged acoustic wave component and additional circuitry disposed on the package substrate.

9. The radio frequency module of claim 8 wherein the marking layer is centered on the bottom surface of the cap substrate.

10. The radio frequency module of claim 8 wherein the marking layer is planar.

11. The radio frequency module of claim 8 wherein the acoustic wave device is a bulk acoustic wave device.

12. The radio frequency module of claim 8 further including one or more pillars between the peripheral wall and the marking layer.

13. A wireless communication device comprising:
an antenna; and
a front end module including one or more packaged acoustic wave components configured to filter a radio frequency signal associated with the antenna, each packaged acoustic wave component including a device substrate, an acoustic wave device mounted on the device substrate, a peripheral wall attached to the device substrate and surrounding the acoustic wave device, and a cap substrate attached to the peripheral wall and spaced above the device substrate, the cap substrate having a marking layer disposed on a bottom surface of the cap substrate that is spaced from and faces the acoustic wave device, the marking layer configured to receive one or more markings thereon, the one or more markings being coordinates associated with a location of the cap substrate on a parent wafer.

14. The wireless communication device of claim 13 wherein the marking layer is centered on the bottom surface of the cap substrate.

15. The wireless communication device of claim 13 wherein the marking layer is planar.

16. The wireless communication device of claim 13 wherein the acoustic wave device is a bulk acoustic wave device.

17. The wireless communication device of claim 13 further including one or more pillars between the peripheral wall and the marking layer.

18. The packaged acoustic wave component of claim 1 wherein the one or more markings are alphanumeric indicia.

19. The radio frequency module of claim 8 wherein the one or more markings are alphanumeric indicia.

20. The wireless communication device of claim 13 wherein the one or more markings are alphanumeric indicia.

\* \* \* \* \*